United States Patent [19]
Pope

[11] Patent Number: 4,996,478
[45] Date of Patent: Feb. 26, 1991

[54] APPARATUS FOR CONNECTING AN IC DEVICE TO A TEST SYSTEM

[75] Inventor: Keith A. Pope, Milwaukie, Oreg.

[73] Assignee: Tektronix, Inc., Beaverton, Oreg.

[21] Appl. No.: 461,160

[22] Filed: Jan. 5, 1990

[51] Int. Cl.$^5$ .......................... G01R 1/06; H01P 1/04; H01R 17/04

[52] U.S. Cl. ................ 324/158 P; 333/260; 439/581

[58] Field of Search ............. 324/158 P, 158 F, 72.5; 333/246, 260; 439/63, 581

[56]  References Cited

U.S. PATENT DOCUMENTS

| | | | |
|---|---|---|---|
| 3,426,311 | 2/1969 | Gifford | 439/63 |
| 3,689,865 | 9/1972 | Pierini et al. | 439/581 |
| 4,125,308 | 11/1978 | Schilling | 439/63 |
| 4,556,265 | 12/1985 | Cunningham | 439/63 |

Primary Examiner—Ernest F. Karlsen
Attorney, Agent, or Firm—William K. Bucher

[57] ABSTRACT

An apparatus for connecting an integrated circuit, IC, device to a test system has a first circuit board on which the IC device is mounted. The circuit board has an analog transmission line interposed between and electrically isolated from digital transmission lines on opposed surfaces of the circuit board. The first circuit board is electrically connected to a second circuit board via coaxial probe assemblies disposed within apertures formed in a frame member mounted on the second circuit board. Each coaxial probe assembly has a connector disposed within one end of the aperture and a coaxial probe disposed with the other end. The connector and the probe head each have a cylindrical outer conductor electrically isolated from a central conductor. The cylindrical conductor and the central conductor of the connector are electrically connected to conductive runs on the second circuit board. The coaxial probe is mechanically connected to the connector and the outer conductor and the central conductor are electrically connected to the respective outer and central conductors of the connector.

22 Claims, 5 Drawing Sheets

APPARATUS FOR CONNECTING AN IC DEVICE TO A TEST SYSTEM

BACKGROUND OF THE INVENTION

The present invention relates to semiconductor test systems and more particularly to an apparatus for connecting an integrated circuit device to such a test system.

Semiconductor test systems are used for testing integrated circuit (IC) devices to verify their performance characteristics In a typical test system, the IC device is placed in a test fixture that is mounted on a device under test (DUT) board. The DUT board has contact pads that are electrically connected to the individual leads of the IC device. Electrical signal probes from the tester are brought into contact with the contact pads on the test board for coupling electrical signals to the IC and for monitoring the signals from the IC.

The LT1000 Semiconductor Test System, manufactured by Tektronix, Inc., Beaverton, Oreg., and the assignee of the present invention, is an example of a semiconductor test system for testing digital IC devices. The LT1000 has a test head for accepting IC devices and a host controller for controlling the transmitting, receiving and processing of signals to and from the IC device under test. The test head has a device under test (DUT) board onto which the IC device is placed. The DUT board has electrically conductive runs leading from the IC and terminating in plated through holes in the board. The through holes in the DUT board are formed in a linear pattern radiating from a central vertical axis of the board. On the opposite side of the DUT board, the plated through hole patterns are electrically connected to electrical test pads that are in a similar linear radiating pattern from the center of the DUT board as the through holes. Mating with the contact pads of the DUT board are spring loaded electrical probes that are connected to pin cards.

The pin cards are arranged on edge in the test head with the cards in a radiating pattern from the center of the test head. The spring loaded probes are mounted in a fixture that is secured to the pin card board. The probes are directly soldered to conductive runs on the card. An electrical interface is provided in the test head for connecting the pin cards to the host controller.

The LT1000 is designed for testing digital IC devices having pin counts from 64 to 256 pins. The number of pin cards used in the test head depends on the pin count of the device being tested. In use, an IC test fixture is mounted on the DUT board for accepting the IC device. The DUT board is designed to accept any IC having a pin count from 64 to 256 pins. A locking mechanism on the test head lowers the DUT board onto the spring loaded probes of the pin cards and locks the board in place. Electrical connectivity from the IC device to the host controller is via the conductive runs on one surface of the the DUT board, the plated through holes, the test pads on the opposite side of the board, the spring loaded probes, the electronic circuitry on the pin cards, the pin card interface, and through umbilical cables from the test head to the controller.

With the development of IC devices that process both digital and analog signals on the same chip, there is a need for a semiconductor test system that can couple both type of signals to and from IC device. However, existing spring loaded probe technology does not provide the necessary signal isolation and impedance matching that is necessary for such testing. In addition, isolation is needed between the digital and analog signals on the circuit boards used in such a system.

To provide the isolation and impedance matching necessary for mixed signal testing of IC's, a coaxial probe is necessary. One example of a coaxial probe is described in U.S. Pat. No. 4,588,241 to Ardezzone. Ardezzone describes an electrical signal probe mounted in a mounting block and having both a movable central conductor and a cylindrical shield conductor electrically insulated from the central conductor. The central conductor of the Ardezzone probe is connected to a central conductor of a coaxial cable and the cylindrical shield conductor is connected to the outer shielding conductor of the cable. A disadvantage of the Ardezzone probe is the difficulty in repairing and replacing defective probes. The coaxial cable electrically connecting the probe to the circuit board must be unsoldered and the probe and the securing means, such as a "C" ring, removed from the probe body before the probe is completely removed from the fixture holding it. Repairs of this type are time consuming in an environment where up to 256 probes are use for testing a device.

What is needed is a semiconductor test system for testing IC devices in a mixed analog and digital signal environment. The system should provide isolation between the analog and digital signals in the test system while at the same time providing ease of serviceability and repair.

SUMMARY OF THE INVENTION

Accordingly, the present invention is an apparatus for connecting an integrated circuit device to a test system having a device under test (DUT) board on which the device is mounted. The circuit board has an analog transmission line interposed between and isolated from digital transmission lines that are on opposed surfaces of the circuit board. The transmission lines are electrically connected to the integrated circuit device. The analog transmission line is electrically connected to one of the surfaces of the circuit board by a via formed from the analog line to the surface. The via forms an electrical contact pad that mates with a coaxial probe assembly mounted on a second circuit board having conductive runs thereon. A frame member is disposed adjacent to the second circuit board and has an aperture formed therein for accepting the coaxial probe assembly. The coaxial probe assembly has a connector disposed within one end of the frame aperture and has a cylindrical outer conductor electrically isolated from a central conductor. The outer conductor and the central conductor are electrically connected to the conductive runs on the second circuit board. A coaxial probe is disposed within the other end of the frame aperture and mechanically mates with the connector. The probe has an cylindrical outer conductor electrically isolated from a central conductor and are electrically connected to the respective outer conductor and central conductor of the connector.

The objects, advantages and novel features of the present invention are apparent from the following detailed description when read in conjunction with the appended claims and attached drawings.

DETAILED DESCRIPTION OF THE PREFERRED EMBODIMENT

Figure 1:
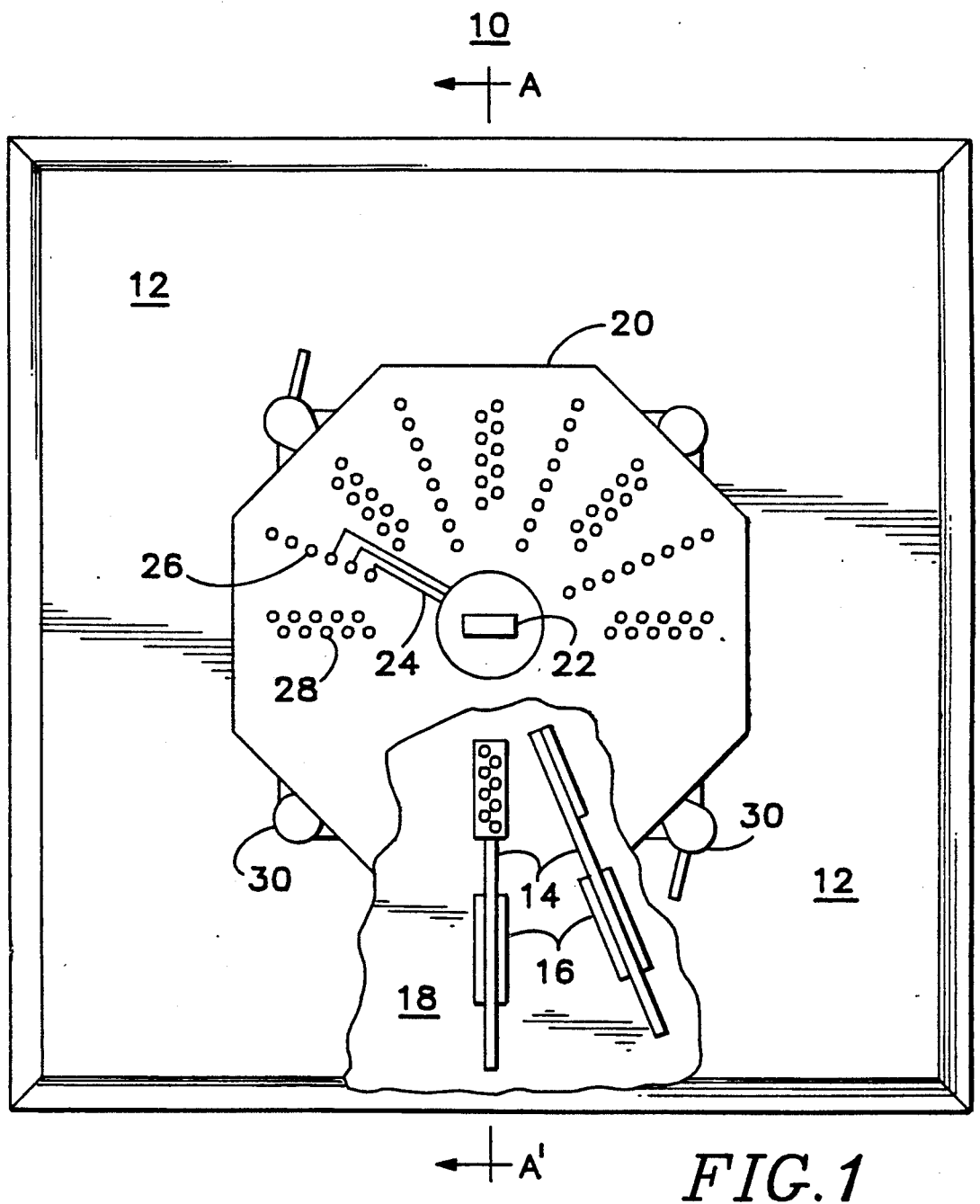
FIG. 1 is a partially cut away view of a test head incorporating the apparatus of the present invention.

Referring to FIG. 1, there is shown a partially cut away plan view of a test head 10 for use in testing integrated circuit, IC, devices in a semiconductor test system. The test head 10 has a tub shaped structure 12 into which are placed coaxial probe cards 14. The coaxial probe cards are inserted into circuit board connectors 16 that are electrically connected to a backplane 18. The backplane 18 is electrically connected to a host controller via umbilical cables, both not shown. A device under test DUT board 20 is mounted on structure 12 in a manner permitting electrical connectivity between the DUT board 20 and the coaxial probe cards 14. The DUT board 20 has an IC test fixture 22 mounted at the center of the board with electrically conductive runs 24 connecting the test fixture 22 with plated through holes 26 in the board. Blind vias 28 extend from conductive runs buried in the DUT board 20 to conductive pads on the opposite side of the board. Mechanical means 30 are provided for lowering and locking the DUT board 20 on the test head 10.

Figure 2:
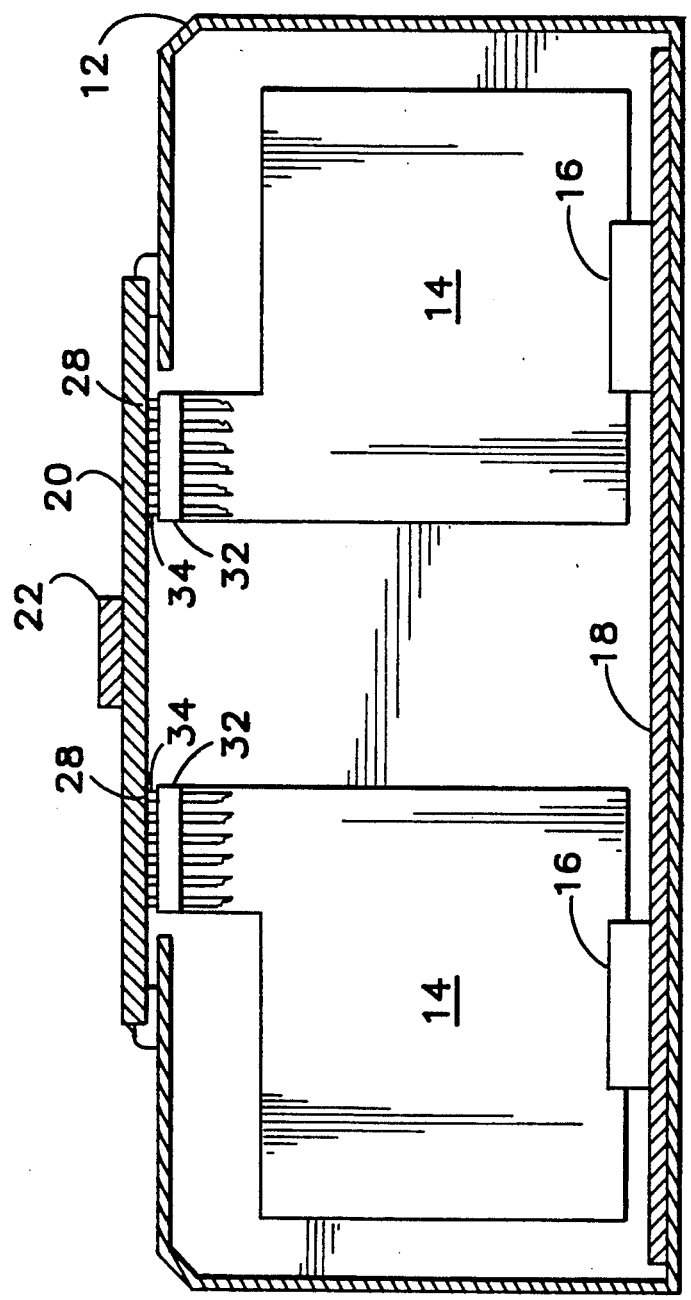
FIG. 2 is a side view of the test head incorporating the apparatus of the present invention.

As is shown in FIG. 1, the plated through holes 26 and the blind vias 28 are in linear rows that radiate from a central vertical axis of the DUT board 20. Likewise, the coaxial probe cards 14 are in a pattern radiating from a central vertical axis of the test head 10. The view of FIG. 2 is a side view of the test head 10 along line A—A'. The coaxial probe cards 14 are placed on edge within the test head 10. The coaxial probe cards 14 are electrically connected to the backplane 18 via connectors 16. On the edge of the coaxial probe card 14 opposite the connector 16 is a frame member 32 for holding coaxial probe assemblies 34. The coaxial probe assemblies 34 mate with the blind vias 28 on the DUT board 20 when the board is lowered into place using the mechanical means 30. The coaxial probe assemblies 34 and the blind vias provide signal isolation and impedance matching for coupling analog signals to and from the IC under test. Where isolation and impedance matching is not critical, such as coupling voltage power to the device or some type of digital signals, standard spring loaded electrical probes are used.

Figure 3:
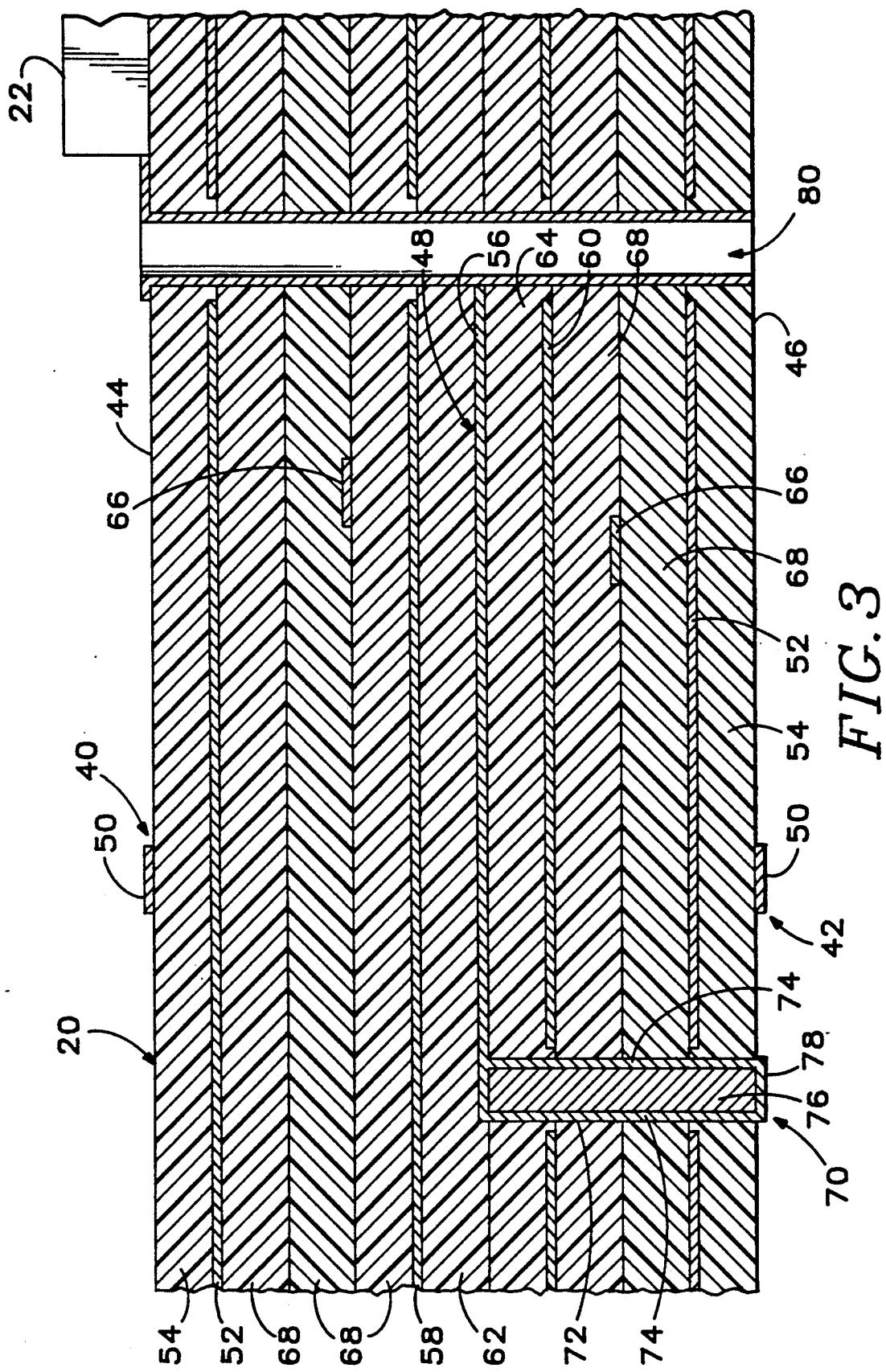
FIG. 3 is a cross-sectional view of a device under test board according to the present invention.

FIG. 3 is a representative cross-sectional view of the DUT board 20 showing the construction of the board. The DUT board is a multilayer circuit board having both digital and analog transmission lines. The digital transmission lines 40 and 42 are formed on the opposed surfaces 44 and 46 of the DUT board 20 and the analog transmission line 48 is formed within the board 20 and interposed between the digital transmission lines 40 and 42. Each of the digital transmission lines is formed by an electrically conductive run 50 separated from a ground plane 52 by layer of circuit board material 54. The analog transmission line 48 is formed by a electrically conductive run 56 interposed between grounding planes 58 and 60 that are separated from the conductive run by circuit board layers 62 and 64. Interposed between digital transmission lines 40, 42 and analog transmission line 48 are power distribution runs 66 for supplying power to the IC. The power distribution runs are separated from the digital and analog transmission lines by circuit board material 68.

To form an electrically conductive pad on the DUT board 20 that mates with the coaxial probe assemblies 34 on the probe cards 14, electrical connectivity between the conductive run 56 of the analog transmission line 48 and one of the surfaces 44, 46 of the DUT board 20 is needed. A blind via 70 is formed in the DUT board 20 for this purpose. The blind via 70 is formed by drilling a hole 72 in the DUT board 20 to the conductive run 56. The sides of the hole are plated with an electrically conductive material 74. The hole 72 is filled in with circuit board material 76 and then a gold plated electrically conductive pad 78 is formed over the filled-in hole. Electrical connectivity between the IC test fixture 22 and the conductive run 56 of the analog transmission line 48 is by a plated through hole 80. Likewise, electrical connectivity between the conductive runs 50 of the digital transmission lines 40 and 42 is by plated through holes.

The structure of the DUT board 20 provides both digital and analog transmission lines that are electrically isolated from each other while at the same time providing impedance matching characteristics that are critical for accurately passing analog signals. These requirements were not met with the DUT board structure used in previous digital test systems. The digital DUT board structure used plated through holes electrically connected to adjacent contact pads. Such a structure would not provide the impedance matching required for analog testing. In addition, signal cross-talk and electromagnetic interference, EMI, would be coupled to the signal via the plated through hole and the runs connecting the through hole to the contact pad.

Figure 4:
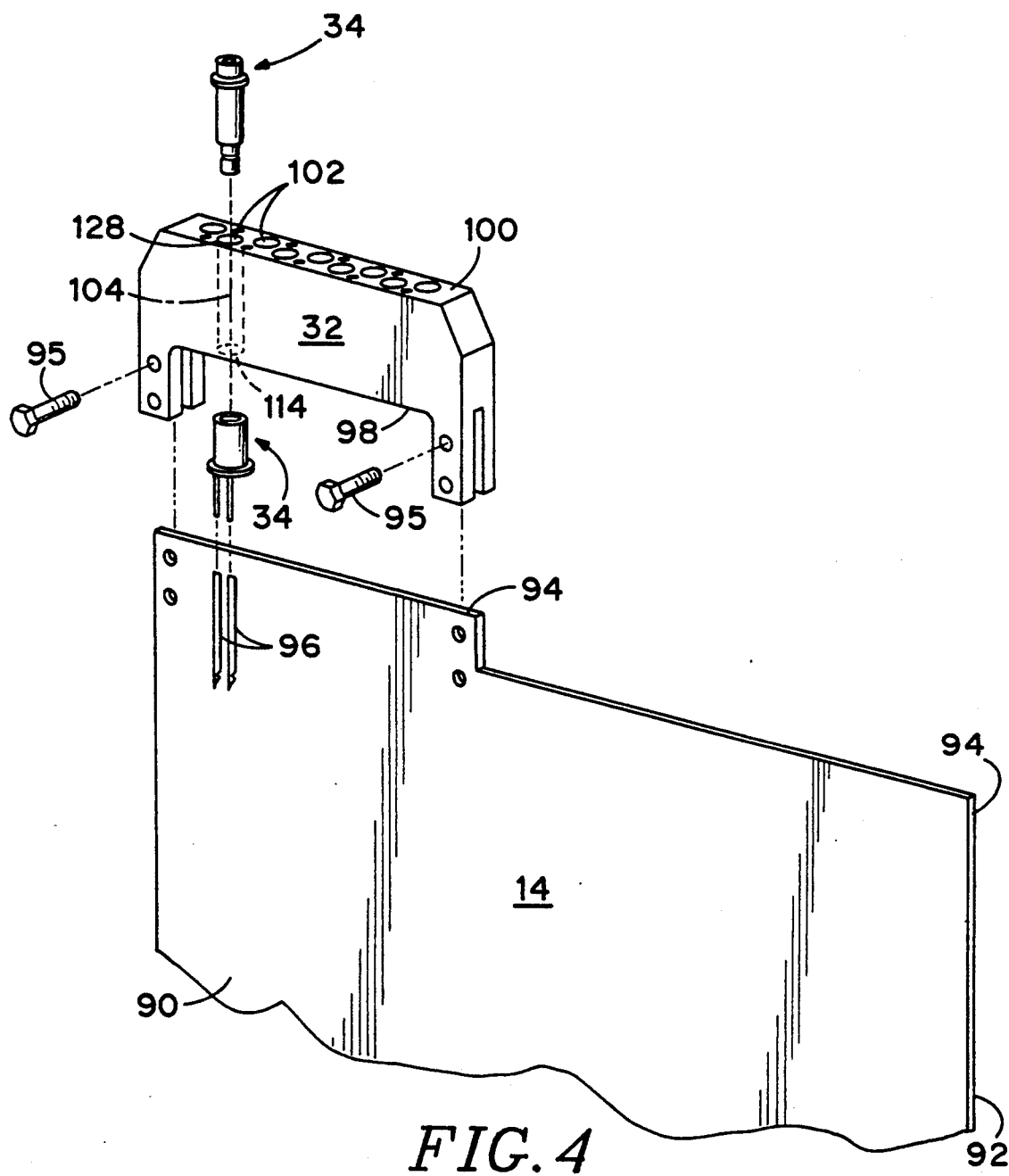
FIG. 4 is an exploded perspective view of the coaxial probe card, frame member, and coaxial probe assembly according to the present invention.

Referring to FIG. 4, there is shown an exploded view of the coaxial probe card 14, the frame member 32, and the coaxial probe assemblies 34. The coaxial probe card 14 has opposed parallel surfaces, respectively numbered 90 and 92, and edge surfaces 94 On the opposed parallel surfaces 90 and 92 are electrically conductive runs 96 that terminate proximate one of the edge surfaces 94. The frame member 32 is mounted on the coaxial probe card 14 at one of the edge surfaces 94 with appropriate securing means, such as rivets, screws, or the like. The frame member 32 has opposed parallel surfaces, respectively numbered 98 and 100. Apertures 102, each having a central axis 104 normal to the opposed parallel surfaces 98 and 100, are formed through the frame member 32 for accepting the coaxial probe assemblies 34. In the preferred embodiment, apertures 102 are formed in two parallel rows in the frame member 32 with the central axes 104 of one row of apertures 102 in line with one of the surfaces 98 and 100 of the coaxial probe card 14 and the central axes 104 of the other row of apertures 102 in line with the other surface of the coaxial probe card 14.

Figure 5:
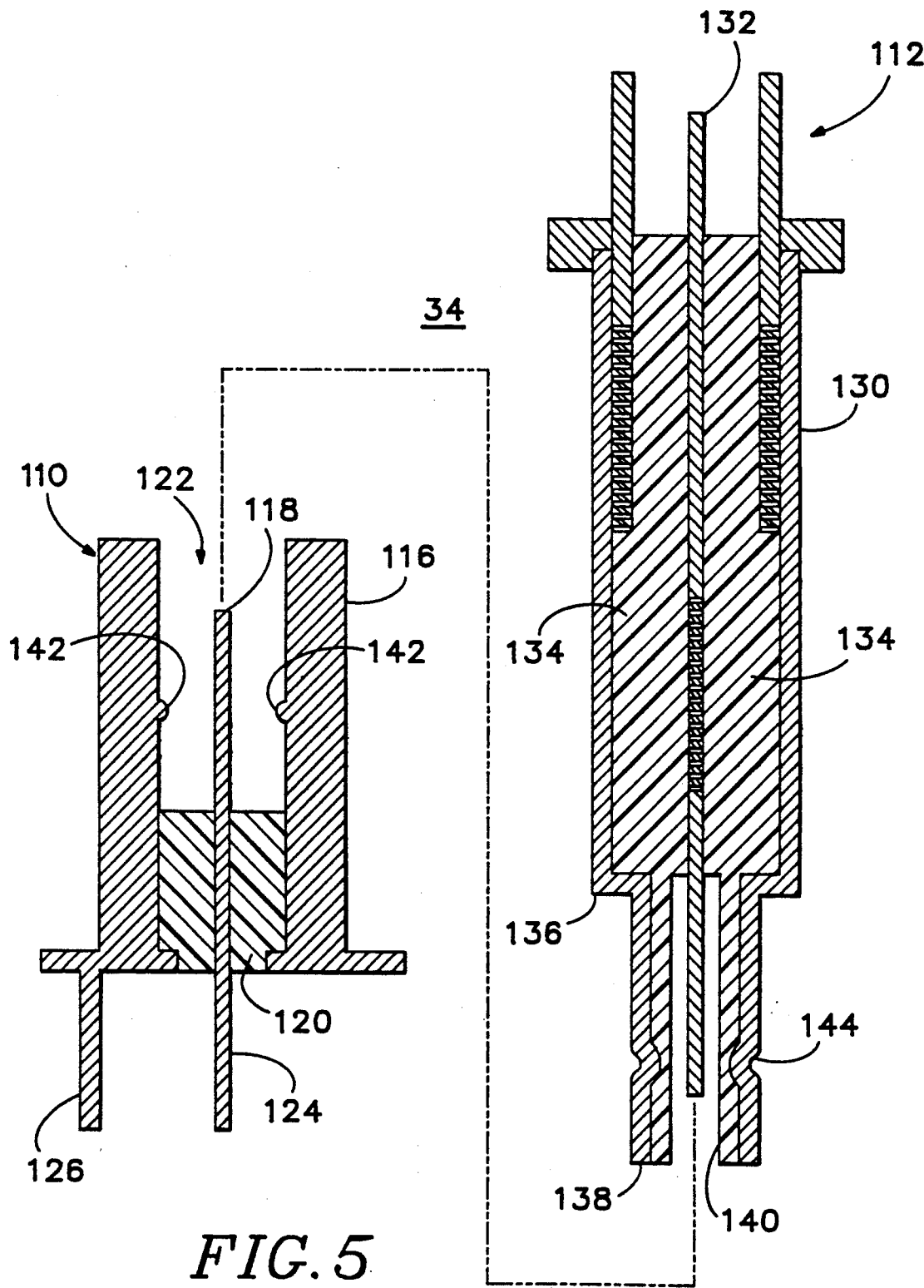
FIG. 5 is a cross-sectional view of the probe head assembly according to the present invention.

Each coaxial probe assembly 34 has a connector 110 and a coaxial probe 112 as shown in the cross-sectional view of FIG. 5. The connector 110 is secured in one end 114 of aperture 102 that is adjacent to the coaxial probe card 14 (FIG. 4). The connector 110 has a cylindrical outer conductor 116 and a central conductor 118 that are electrically isolated from each other by insulating material 120. The end of the connector 110 inserted into the aperture 102 has the insulating material removed to form a sleeve 122 into which the central conductor 118 extends. At the other end of the connector 110, electrical leads 124 and 126 extend from the cylindrical outer conductor 116 and the central conductor 118 and are electrically connected to the conductive runs 96 on the coaxial probe card 14 (FIG. 4).

The coaxial probe 112 is secured in the other end 128 of aperture 102 and mechanically mates with the connector 110. The coaxial probe has a cylindrical outer conductor 130 and a central conductor 132 that are electrically separated from each other by insulating material 134. The outer conductor 130 has a first diameter 136 matching the diameter of the aperture 102 and a second smaller diameter 138 matching the sleeve 122 diameter of the conductor 110. A portion of the insulating material is removed from the region of the smaller diameter outer conductor 138 to form a sleeve 140 into which the central conductor 132 extends. The smaller diameter outer conductor 138 is inserted into the aperture 102 to mate with the connector 110. The cylindrical outer conductor 130 and the central conductor 132 at the other end of the coaxial probe 112 independently move with respect to each other along the axis of the probe.

The structure of the coaxial probe assembly 34 provides the required impedance matching characteristics necessary for coupling analog signals between the DUT board 20 and the coaxial probe card 14 while at the same time providing an easily replaceable coaxial probe 112. The smaller diameter outer conductor 138 of the coaxial probe 112 slidably mates with the cylindrical outer conductor 116 of the connector providing the electrical continuity between the outer conductors. At the same time the central conductor 132 of the coaxial probe slidably mates with the central conductor 118 of the connector providing the electrical continuity between the central conductors. The coaxial probe 112 and the connector 110 are mechanically secured by a rib 138 formed in the sleeve 122 of the connector 110 mating with a notch 144 formed in the smaller diameter outer conductor 138 of the coaxial probe 112.

An alternative method of mounting the frame member 32 is to place the frame member flush against one on the opposed parallel surfaces 90 and 92 of the coaxial probe card 14. In this configuration, the electrical leads 124 extending from the connector 110 of the coaxial probe assembly 34 are inserted into plated through holes and soldered into place.

An apparatus has been described for connecting an integrated circuit device to a semiconductor test system that couples both analog and digital signals to the device. A first circuit board, the DUT board, provides both digital and analog transmission lines that are electrically isolated from each other and provides the impedance matching required for accurate analog signal transmission. Coaxial probes are connected to a second circuit board and are brought into contact with the first circuit board for coupling the analog and digital signals to and from the host controller of the test system. The coaxial probes are part of a coaxial probe assembly that is secured in a frame member that is mounted to the second circuit board. The coaxial probe assembly has a connector that is inserted into one end of an aperture formed in the frame member and is electrically connected to the second circuit board. The coaxial probe mechanically and electrically mates with the connector to provide an impedance matching path for signal transmission. These and other aspects of the present invention are set forth in the appended claims.

I claim:
1. A coaxial probe mounting system comprising:
   a circuit board having conductive runs thereon;
   a frame member disposed adjacent to the circuit board and a coaxial probe assembly including:
   a connector disposed within one end of the frame aperture and having a central conductor coaxially disposed with and electrically insulated from a cylindrical outer conductor by an insulating material, the cylindrical outer conductor and the central conductor at one end of the connector electrically connected to individual conductive runs on the circuit board and the other end having a portion of the insulating material removed forming a sleeve into which the central conductor extends, the cylindrical outer conductor having a rib formed therein extending into the sleeve; and
   a removable coaxial probe disposed within the other end of the frame aperture and having a central conductor coaxially disposed with and electrically insulated from a cylindrical outer conductor by an insulating material, the outer conductor and the central conductor at one end of the coaxial probe forming a coaxial probing tip and the other end having a notch formed in the cylindrical outer conductor for engaging the rib of the cylindrical outer conductor of the connector for securing the coaxial probe in the connector, the cylindrical outer conductor and the central conductor of the coaxial probe electrically contacting the respective outer conductor and central conductor of the connector.

2. The coaxial probe mounting system of claim 1 wherein the circuit board further comprises opposed parallel surfaces and edge surfaces with the conductive runs formed on the opposed parallel surfaces terminating proximate one of the edge surfaces of the circuit board.

3. The coaxial probe mounting system of claim 1 wherein the circuit board further comprise conductive runs formed within the circuit board and terminating in electrically conductive through hole vias proximate one the edge surfaces of the circuit board.

4. The coaxial probe mounting system of claim 3 wherein the frame member further comprises:
   opposed parallel surfaces with the aperture having a central axis that is normal to the surfaces; and
   means for securing the frame member to the circuit board.

5. The coaxial probe mounting system of claim 4 wherein the frame member further comprises a plurality of apertures each having a central axis that is normal to the opposed parallel surfaces.

6. The coaxial probe mounting system of claim 5 wherein one of the opposed parallel surfaces of the frame member is positioned on one of the edge surfaces of the circuit board and the plurality of apertures formed in the frame member are disposed in two parallel rows with the central axes of one row of apertures parallel with one of the opposed surfaces of the circuit board and the central axes of the other row of apertures parallel with the other opposed surface of the circuit board.

7. The coaxial probe mounting system of claim 6 wherein the central conductor of the coaxial probe is coextensive with the central axis of the frame aperture and the cylindrical outer conductor and the central conductor of the coaxial probing tip move independent of each other along the axis of the aperture.

8. An apparatus for coupling electrical signals to and receiving electrical signal from a device under test board having a semiconductor device thereon comprising:
   a circuit board having conductive runs thereon;
   a frame member disposed adjacent to the circuit board and having an aperture formed therethrough; and
   a coaxial probe assembly including:
      a connector disposed within one end of the frame aperture and having a central conductor coaxially disposed with and electrically insulated from a cylindrical outer conductor by insulating material, the cylindrical outer conductor and the central conductor at one end of the connector electrically connected to individual conductive runs on the circuit board and the other end having a portion of the insulating material removed forming a sleeve into which the central conductor extends, the cylindrical outer conductor having a rib formed therein extending into the sleeve; and
      a removable coaxial probe disposed within the other end of the frame aperture and having a central conductor coaxially disposed with and electrically insulated from a cylindrical outer conductor by an insulating material, the outer conductor and the central conductor at one end of the coaxial probe forming a coaxial probing tip and the other end having a notch formed in the cylindrical outer conductor for engaging the rib of the cylindrical outer conductor of the connector for securing the coaxial probe in the connector, the cylindrical outer conductor and the central conductor of the coaxial probe electrically contacting the respective outer conductor and central conductor of the connector.

9. The apparatus of claim 8 wherein the circuit board further comprises opposed parallel surfaces and edge surfaces with the conductive runs formed on the opposed parallel surfaces terminating proximate one of the edge surfaces of the circuit board.

10. The apparatus of claim 8 wherein the circuit board further comprise conductive runs formed within the circuit board and terminating in electrically conductive through hole vias proximate one of the edge surfaces of the circuit board.

11. The apparatus of claim 10 wherein the frame member further comprises:
   opposed parallel surfaces with the aperture having a central axis that is normal to the surfaces; and
   means for securing the frame member to the circuit board.

12. The apparatus of claim 11 wherein the frame member further comprises a plurality of apertures each having a central axis that is normal to the opposed parallel surfaces.

13. The apparatus of claim 12 wherein one of the opposed parallel surfaces of the frame member is positioned on one of the edge surfaces of the circuit board and the plurality of apertures formed in the frame member are disposed in two parallel rows with the central axes of one row of apertures parallel with one of the opposed surfaces of the circuit board and the central axes of the other row of apertures parallel with the other opposed surface of the circuit board.

14. The apparatus of claim 13 wherein the central conductor of the coaxial probe is coextensive with the central axis of the frame aperture and the cylindrical outer conductor and the central conductor of the coaxial probing tip move independent of each other along the axis of the aperture.

15. A coaxial probe mounting system for use in a semiconductor device testing apparatus comprising:
   a circuit board having opposed parallel surfaces and edge surfaces with conductive runs formed on the opposed parallel surfaces terminating proximate one of the edge surfaces of the circuit board;
   a frame member having opposed parallel surfaces with an aperture formed therethrough having a central axis normal to the opposed parallel surfaces, the frame member having one of the opposed parallel surfaces positioned adjacent to one of the edge surfaces of the circuit board; and
   a coaxial probe assembly including:
      a connector disposed within one end of the frame aperture and having a central conductor coaxially disposed with and electrically insulated from a cylindrical outer conductor by an insulative material, the outer conductor and the central conductor being coaxial with the axis of the aperture and electrically connected to individual conductive runs of the circuit board at one end of the connector and having a portion of the insulating material removed forming a sleeve into which the central conductor extends at the other end, the cylindrical outer conductor having a rib formed therein extending into the sleeve; and
      a removable coaxial probe disposed within the other end of the frame aperture and having a central conductor coaxially disposed with and electrically insulated from a cylindrical outer conductor by an insulative material with one end of the coaxial probe forming a coaxial probing tip and the other end having a notch formed in the cylindrical outer conductor for engaging the rib of the cylindrical outer conductor of the connector for securing the coaxial probe in the conductor, the cylindrical outer conductor and the central conductor of the coaxial probe electrically contacting the respective outer conductor and central conductor of the connector and the cylindrical outer conductor and the central conductor of the coaxial probing tip moving independently with respect to each other along the axis of the aperture.

16. The coaxial probe mounting system of claim 15 further comprising a means for securing the frame member to the circuit board.

17. The coaxial probe mounting system of claim 16 wherein the frame member further comprises a plurality of apertures each having a central axis that is normal to the opposed parallel surfaces.

18. The coaxial probe mounting system of claim 17 wherein the plurality of apertures formed in the frame member are disposed in two parallel rows with the central axes of one row of apertures parallel with one of the opposed surfaces of the circuit board and the central axes of the other row of apertures parallel with the other opposed surface of the circuit board.

19. An apparatus for connecting an integrated circuit device to a test system comprising:
   a first circuit board having top and bottom surfaces with the integrated circuit device mounted on one of the surfaces, the circuit board including:
      top and bottom digital signal transmission lines with each line being formed of a signal transmission layer and a ground plane layer, the respective signal transmission layers being formed on the top and bottom surfaces of the circuit board;
      an analog signal transmission line interposed between the digital signal transmission lines with the analog line having a signal transmission layer interposed between adjacent ground plane layers, the signal transmission layer being electrically connected to the one of the surfaces of the circuit board by a via formed from the signal transmission layer to the surface; and
      a power distribution layer interposed between the digital signal transmission line and the analog signal transmission line;
   a second circuit board having opposed parallel surfaces and edge surfaces with conductive runs formed on the opposed parallel surfaces terminating proximate one of the edge surfaces of the circuit board;
   a frame member having opposed parallel surfaces with an aperture formed therethrough having a central axis normal to the opposed parallel surfaces, the frame member having one of the opposed parallel surfaces positioned adjacent to one of the edge surfaces of the circuit board; and
   a coaxial probe assembly including:
      a connector disposed within one end of the frame aperture and having a central conductor coaxially disposed with and electrically insulated from a cylindrical outer conductor by an insulative material, the outer conductor and the central conductor being coaxial with the axis of the aperture and electrically connected to individual conductive runs of the circuit board; and
      a removable coaxial probe disposed within the other end of the frame aperture and having a central conductor coaxially disposed with and electrically insulated from a cylindrical outer conductor by an insulative material with one end of the coaxial probe forming a coaxial probing tip and the other end electrically contacting the respective outer conductor and central conductor of the connector, the coaxial probing tip being positioned adjacent to the first circuit board for electrically connecting one of the transmission lines to the second circuit board.

20. The apparatus of claim 19 further comprising a means for securing the frame member to the second circuit board.

21. The apparatus of claim 19 wherein the frame member further comprises a plurality of apertures each having a central axis that is normal to the opposed parallel surfaces.

22. The apparatus of claim 21 wherein the plurality of apertures formed in the frame member are disposed in two parallel rows with the central axes of one row of apertures parallel with one of the opposed surfaces of the second circuit board and the central axes of the other row of apertures parallel with the other opposed surface of the second circuit board.

* * * * *